Figure 1:
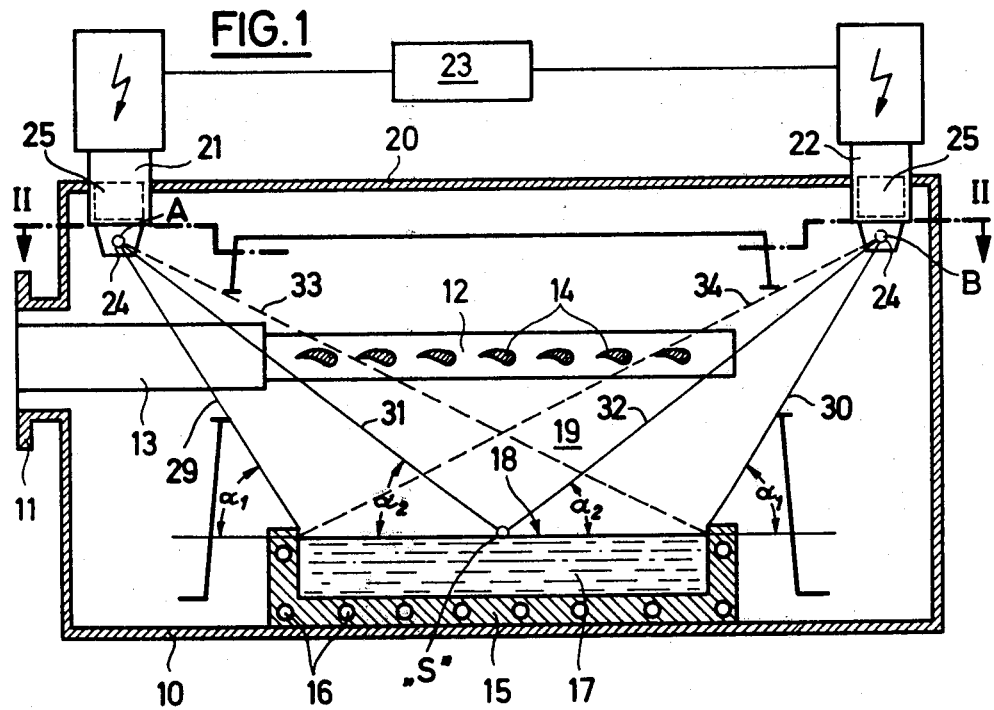

United States Patent [19]
Aichert et al.

[11] 4,238,525
[45] Dec. 9, 1980

[54] METHOD AND APPARATUS FOR VACUUM DEPOSITING THIN COATINGS USING ELECTRON BEAMS

[75] Inventors: Hans Aichert; Walter Dietrich, both of Hanau am Main; Friedrich Stark, Langenselbold; Herbert Stephan, Bruchköbel, all of Fed. Rep. of Germany

[73] Assignee: Leybold-Heraeus GmbH, Cologne, Fed. Rep. of Germany

[21] Appl. No.: 960,895

[22] Filed: Nov. 15, 1978

[30] Foreign Application Priority Data

Mar. 21, 1978 [DE] Fed. Rep. of Germany ....... 2812311

[51] Int. Cl.³ .............................................. B05D 3/06
[52] U.S. Cl. ................................. 427/42; 118/50.1; 219/121 EB; 427/250
[58] Field of Search ................... 427/42, 250; 219/121 EB, 121 EM; 118/49.1, 49.5, 50.1

[56] References Cited

U.S. PATENT DOCUMENTS

| | | | |
|---|---|---|---|
| 3,912,826 | 10/1975 | Kennedy | 427/38 |
| 4,110,893 | 9/1978 | Elam et al. | 427/250 |

FOREIGN PATENT DOCUMENTS

| | | | |
|---|---|---|---|
| 1806514 | 6/1969 | Fed. Rep. of Germany . | |
| 1941254 | 8/1969 | Fed. Rep. of Germany . | |
| 2352057 | 10/1973 | Fed. Rep. of Germany . | |
| 1349184 | 12/1963 | France | 427/42 |
| 72960 | 5/1970 | German Democratic Rep. . | |
| 121802 | 8/1976 | German Democratic Rep. . | |

*Primary Examiner*—John H. Newsome

[57] ABSTRACT

Method and apparatus for vacuum depositing thin films on substrates which are located above 500° C. by electron beam heating during the deposition. The substrates are positioned above an evaporating crucible filled with a bath of the material being evaporated which is also heated by electron beams. The electron beams are deflected at an angle of less than 80° onto approximately one-half of the bath surface situated between the axis of symmetry and the end of the evaporating crucible.

8 Claims, 2 Drawing Figures

METHOD AND APPARATUS FOR VACUUM DEPOSITING THIN COATINGS USING ELECTRON BEAMS

BACKGROUND

This invention relates to a method for the vacuum deposition of thin coatings on substrates which are heated during the evaporation to more than 500° C. by electron beam heating, the substrates being held above an evaporating crucible filled with a bath of the material being deposited which is likewise heated by electron beams.

From a publication by Chromalloy Corporation entitled "High Temperature Resistant Coatings for Superalloy" Seelig et al., it is known to deposit surface coatings of highly resistant alloys from vapors onto gas turbine blades for the purpose of increasing the load capacity of the blades. Special attention must be given in this case to a reliable bonding of the vacuum deposited coating or coatings to the substrate. The strength of adhesion can be substantially improved, for example, by intermetallic difussion, it being necessary for this purpose to keep the substrates, such as turbine blades and the like, at a high temperature level in the range of, for example, of 900° C. to 1000° C. during the vacuum deposition.

It is known to provide resistance radiant heating bodies or special electron guns for the heating of the substrate. It is likewise known to deflect periodically the electron beam used for the heating of the material being vaporized such that it will impinge alternately upon the material being vaporized and the substrate. In this case, however, no electron beam heating of the bath takes place while the electron beam is dwelling upon the substrate. The electrons which are necessarily reflected and not utilized for heating are in any case lost insofar as heating purposes are concerned, since in the known process no attention has been paid to the arrangement among the electron beam source, the bath and the substrate.

To a small degree, the substrates are heated by thermal radiation of the bath and by the heat of condensation of the deposited coating material. However, at best, only about 10 to 15% of the overall heat requirement of the substrates can be supplied in this manner.

SUMMARY

The invention provides a vacuum depositing method of the kind described above, in which an uninterrupted and therefore extremely effective bath heating is achieved, and in which the provision of additional heat sources for the heating of the substrate can be completely, or at least to a great extent, dispensed with. It is to be noted that a separate heating of the substrate requires not only a constant supply of energy, but also special considerations in the construction of the apparatus, such as, for example, voltage and current leads through the vacuum chamber, which are troublesome and expensive, as well as special radiation shielding etc.

According to the invention, electron beams are deflected at an angle less than 80° onto the half of the bath surface that is situated between the axis of symmetry and the end of the evaporation crucible.

The effect of such a measure, with due consideration for the constructive measures to be explained further in the detailed description of the invention, is that the electrons reflected from the half of the bath surface that is bombarded by the electron beams impinge, on the basis of given reflection laws, upon those substrates which are disposed above the opposite half of the bath. If two or more guns are symetrically arranged, each electron gun will directly heat about one half of the bath, while the reflected electrons will strike the substrates disposed above the other half of the bath and heat them. The proportion of the reflected electrons increases as the angle of incidence of the electron beam on the bath surface becomes lower. It thus becomes possible by varying this angle to control within certain limits the proportion of the energy to be utilized in heating the substrates. In any case, it is possible by the invention to use some 60% of the energy to heat a bath of corrosion resistant metal alloy to around 1700° C. and at the same time to apply about 40% of the energy to heating the substrates to around 1000° C., without having to make any other provisions for heating the substrates. Due to the fact that the reflected electrons are directed against the substrates, the electron bombardment of apparatus parts is largely avoided, so that the apparatus parts in question no longer have to be forcecooled to any great extent. In this manner a large part of the power loss is avoided, which is a matter of importance in a period of increasing scarcity and cost of energy.

DESCRIPTION

An angle of incidence lower than 60° is preferred. It is possible to perform the bombardment of the bath surface either by means of a stationary, diffuse electron beam, or by means of linewise scanning with a focused electron beam. The latter method has the advantage that the energy density can be varied locally.

As it has been stated above, the heat radiated from the bath also contributes towards the substrate heating. However, the substrates disposed at the ends of the evaporating crucible are at a disadvantage in this regard. The reason for this is that the substrates disposed in the center receive the radiant heat from a larger bath area than those situated at the ends, because there there is a "shortage" of radiating bath area. To equalize this radiant heating effect, according to the invention, the electron beam can be made to dwell longer approximately at the center of the bath, for on the basis of the reflection laws it is seen that an electron beam striking in the center of the bath produces reflected electrons whose flight paths terminate at the outer substrates.

The invention furthermore relates to a vacuum depositing apparatus for the practice of the method described above. A conventional vacuum depositing apparatus consists generally of a vacuum chamber with an elongated evaporating crucible with long sides and short sides, and with a substrate holder for the flat arrangement of a plurality of substrates above the evaporating crucible in a substantially uniform distribution over the surface of the crucible. It also has at least two electron guns each having at least one deflecting system for the heating of the evaporating crucible.

A vacuum depositing apparatus of this kind is characterized in accordance with the invention by the fact that the electron guns are disposed at the short sides of the evaporating crucible, that the lines connecting the deflection system to the short axis of symmetry "S" of the evaporation crucible on the one hand and to the end of the evaporation crucible nearest the gun on the other hand include an angle with the bath surface of less than 80°, at least one electron gun being associated with each half of the bath.

A vacuum depositing apparatus of this design provides the conditions for the practice of the method of the invention. The reference to the "connecting lines" between the deflection system on the one hand the short axis of symmetry on the one hand, and the gun end of the evaporating crucible on the other constitute clear instructions for the average technical expert. It is desirable to use for such a vacuum depositing apparatus tubular guns such as those described in German Pat. No. 1,248,175. Such an electron gun produces a rectilinear, narrow electron beam which can be deflected in a deflection system at an angle of more than 90°. After deflection, the electron beam continues on a straight line out of the deflection system. It is especially advantageous to use an X-Y deflection system with which virtually the entire bath surface can be swept. The reference to the connecting lines gives the average technical expert a clear indication of the point at which he must mount the deflection system and hence the electron gun in order to bring about the specified geometrical relationships.

The vacuum depositing apparatus of the invention is best operated batch-wise, i.e., a depositing operation is preceded by a chamber loading phase; it is followed by an unloading phase, and then a reloading with fresh substrates. During the entire interruption of the depositing process, the temperature of the bath is to be kept constant insofar as possible. Since in the specified arrangement, the substrate holder crosses the radiation path of one of the two electron guns during the loading, this electron gun must be shut off. In order in this case to assure a uniform maintenance of the temperature of the bath over its entire surface, the deflection system is provided with a control system whereby the beam deflection of the still operating electron gun can be extended at will to the opposite bath half.

Figure 2:
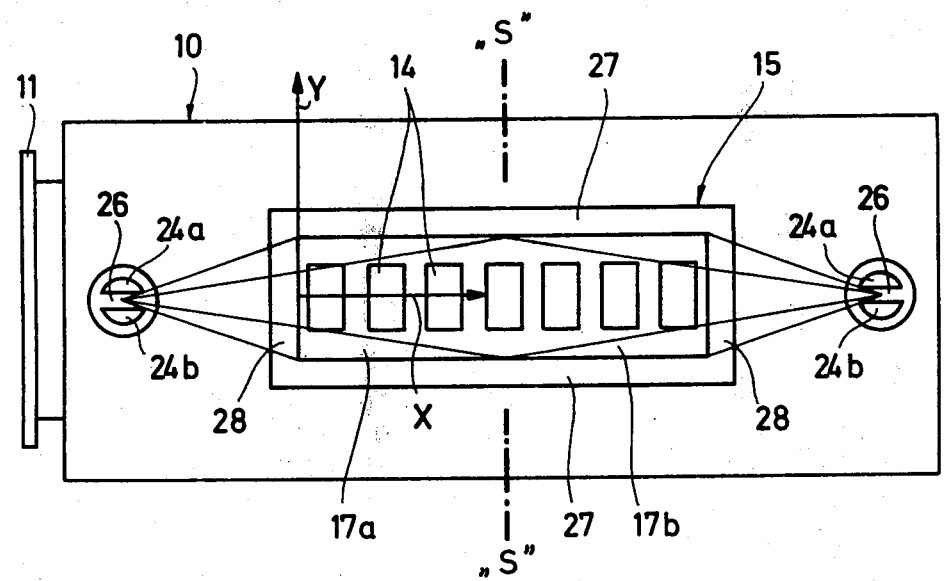

An example of the embodiment of the subject matter of the invention will now be further described with the aid of FIGS. 1 and 2.

FIG. 1 is a vertical cross-sectional view taken through vacuum depositing apparatus of the invention for the discontinuous vacuum coating of turbine blades; and FIG. 2 is a cross-section taken along line II—II of FIG. 1.

In FIG. 1, there is represented a vacuum chamber 10 having on the left side a connecting flange 11 for connection to a lock chamber (not shown) and a preheating chamber (not shown). Through the connecting flange 11 a substrate holder 12 fastened to a rod 13 extends horizontally into the vacuum chamber 10. Substrates 14 in the form of turbine blades are fastened to the substrate holder 12 in such a manner that they virtually cover the horizontal surface ascribed to them except for small gaps.

Underneath the substrate holder 12 there is disposed an evaporating crucible 15 which consists of metal and has cooling passages 16. The evaporating crucible contains a bath 17 of molten material for evaporation. The material expended by evaporation is replaced by an automatic feed system (not shown). The bath 17 is defined at the top by a bath surface 18. Between the bath surface and the substrates 14 an approximately parallelepipedal chamber 19 is formed through which the vapor ascends from the bath surface 18 to the substrates 14.

In a roof 20 of the vacuum chamber are disposed two electron guns 21 and 22 which are supplied with electric power through a control system 23. This control system supplies the guns 21 and 22 not only with the required high voltage but also with heating current for the cathodes of the guns. The control system 23 also generates the required signals for the deflection of the electron beam. For beam deflection purposes, the guns 21 and 22 are provided with an X-axis deflection system 24 and a Y-axis deflection system 25. The X-axis deflection system 24 consists of two projecting pole shoes 24a and 24b which enclose between them an air gap 26 through which flow the magnetic lines of force. Within this gap, the electron beam can be deflected by an angle of up to 90° or more. The Y-axis deflection system produces a smaller beam deflection and consequently, as indicated in broken lines, it can be disposed within the electron guns 21 and 22.

The evaporating crucible 15 has a rectangular plan with two long sides 27 and two short sides 28. The bath 17 is accordingly divided by the short axis of symmetry "S" into two bath halves 17a and 17b.

Above the bath surface 18 and outside of the short sides 28 are disposed the electron guns 21 and 22, whose axes are located in a plane of symmetry of the vaporizing crucible 15 which is perpendicular to the short axis of symmetry "S" (section plane in FIG. 1). The spatial arrangement of the electron guns 21 and 22 with respect to the bath surface 18 and the substrates 14 is based on the following considerations whose geometrical foundations are to be further explained with the aid of FIG. 1, the numerical values stated being given only by way of example.

Connecting lines 29 and 30 are drawn upwardly and outwardly from the line of contact of the bath surface 18 with the short sides 28, at an angle $\alpha 1$ of 58° to the bath surface From the short axis of symmetry S located at the bath surface 18, connecting lines 31 and 32, respectively, are drawn towards both sides at an angle $\alpha 2$ of 38°. The lines 29 and 31 intersect at a point A; the lines 30 and 32 intersect at a point B. These points determine the positions in space of the pole shoes of the X-axis deflection system 24 of the electron guns 21 and 22. The position of the electron guns themselves is determined by the position of their deflection systems. By the appropriate control of the X-axis deflection systems, a focused electron beam fired by gun 21 can be deflected between the lines 29 and 31, sweeping the left half of the bath 17a according to a specific pattern. In like manner, an electron beam fired by the gun 22 can be deflected within the area between lines 30 and 32, sweeping the bath half 17b situated on the right side. The lines 29 to 32 can also be interpreted as electron beams at maximum deflection. It is apparent that the two electron beams pass underneath the substrates 14 within the indicated deflection ranges. Electrons are reflected from the bath surface of the left half 17a, and impinge substantially upon the right half of the substrates 14. On the other hand, electrons are reflected from the right half 17b and impinge upon the left half of the substrates 14. The electron paths thus cross such that the entire area in which the substrates 14 are disposed is struck by a curtain of electrons.

It can also be seen from FIG. 1 that, for example, the center substrate 14 receives thermal radiation from the left and right side of the bath surface 18, while the two outermost substrates 14 receive the thermal radiation only from beneath them and from one side. For the purpose of equalizing the differing effects of the radiation, the electron beams are deflected in such a manner that their dwell time per unit of area of the bath surface 18 is longer in the vicinity of the axis of symmetry S than it is in the area of the short sides 28. On the basis of the laws of electron reflection, the result will be that the outer substrates 14, on the basis of average time, will receive a greater energy density from the reflected electrons, whereby the lesser amount of thermal radiation they receive will be equalized.

Two additional, broken lines 33 and 34 are represented running from points A and B and joining points A and B to their respective far short sides 28 of the evaporating crucible 15. By appropriate control of the X-axis deflection system 24 it can be brought about that the electron beams are deflected all the way to the lines 33 and 34, respectively. The significance of this is as follows: Whenever the rod 13 draws the substrate holder 12 with substrates 14 leftward out of the vacuum chamber 10, the electron gun 21 has to be shut off. To prevent the left half 17a of the bath from cooling in this case, the deflection angle of the electron beam from the right electron gun 22 is extended in that instant all the way to line 34 onto the left half 17a of the bath since the substrates 14 on the right can no longer be struck by the more greatly deflected electron beam.

In FIG. 2, the deflection ranges in the direction of the Y-axis are represented by light lines emerging from the air gaps 26. This is, in each case, the maximum deflection of the electron beam, care being taken that the margins of the evaporating crucible 15 are not unduly struck by the electron beams.

What is claimed is:

1. Method for vacuum depositing thin films on substrates which are heated at more than 500° C. by bombardment by reflected electrons during the depositing which comprises holding the substrates above an elongated evaporating crucible having long sides and short sides and filled with a bath of the material to be evaporated and heating the substrates with reflected electrons by providing at least two electron beams generated at the short sides and deflecting the electron beams at an angle lower than 80° onto approximately half of the bath surface situated between the shorter axis of symmetry and the associated short side of the evaporating crucible.

2. Method of claim 1 wherein the bombardment of the bath surface is performed by means of a stationary, diffuse electron beam.

3. Method of claim 1 wherein the bombardment of the bath surface is performed by line-wise scanning by means of a focused electron beam.

4. Method of claim 1 wherein the reduced influence of thermal radiation on the substrates disposed at the ends of the evaporating crucible is compensated approximately by a longer dwell time of the electron beam in an area approximately in the middle of the bath.

5. Method of claim 1 wherein the substrates are turbine blades which are coated with corrosion and oxidation resistant alloy layers.

6. Method of claim 1 wherein the alloys are from the group of CoCrAlY and NiCoCrAly.

7. Vacuum depositing apparatus for depositing thin films on substrates heated at more than 500° C. by electron beam heating during the deposition comprising vacuum chamber means having an elongated evaporating crucible means with long sides and short sides for holding a bath of material to be evaporated, substrate holder means for the flat disposition of a plurality of substrates above the evaporating crucible means in a substantially uniform distribution above the surface thereof and means for heating the substrates by reflected electrons comprising at least two electron gun means disposed at the short sides of the evaporating crucible means and means for deflecting the beams at an angle smaller than 80° C. onto approximately half of the bath surface situated between the shorter axis of symmetry and the associated short side of the crucible means.

8. Apparatus of claim 7 wherein control system means are associated with said deflection system whereby the beam deflection can be extended to the bath half that is farther from the individual electron gun means.

* * * * *